United States Patent [19]

Sakane et al.

[11] Patent Number: 4,975,922

[45] Date of Patent: Dec. 4, 1990

[54] MULTI-LAYERED DIELECTRIC FILM

[75] Inventors: Chitose Sakane, Tenri; Haruhisa Takiguchi, Nara; Hiroaki Kudo, Tenri; Satoshi Sugahara, Nara, all of Japan

[73] Assignee: Sharp Kabushiki Kaisha, Osaka, Japan

[21] Appl. No.: 368,274

[22] Filed: Jun. 19, 1989

[30] Foreign Application Priority Data

Jun. 27, 1988 [JP] Japan ................. 63-158773

[51] Int. Cl.⁵ ............................................. H01S 3/19
[52] U.S. Cl. ...................................................... 372/49
[58] Field of Search ........................................... 372/49

[56] References Cited

U.S. PATENT DOCUMENTS

| | | | |
|---|---|---|---|
| 3,849,738 | 11/1974 | Hakki | 372/49 |
| 4,280,107 | 7/1981 | Scifres et al. | 372/49 |
| 4,483,899 | 11/1984 | Kuwabara | 428/213 |
| 4,589,115 | 5/1986 | Burnham et al. | 372/20 |

FOREIGN PATENT DOCUMENTS 2134282  8/1984  United Kingdom .

OTHER PUBLICATIONS

Japanese Journal of Applied Physics vol. 26, No. 3, Mar., 1987 pp. 410-415, Kinoshita et al.

Primary Examiner—William L. Sikes
Assistant Examiner—Georgia Epps
Attorney, Agent, or Firm—Irell & Manella

[57] ABSTRACT

A multi-layered dielectric film that is coated on the end surfaces or other surfaces of optical products, wherein said multi-layered dielectric film is composed of alternate layers consisting of two kinds of dielectric layer, one of which is a first dielectric layer of $TiO_2$ or $ZnS$ with a high refractive index $n_1$ and the other of which is a second dielectric layer of $Al_2O_3$ with a low refractive index $n_2$.

2 Claims, 2 Drawing Sheets

MULTI-LAYERED DIELECTRIC FILM

BACKGROUND OF THE INVENTION

1. Field of the invention

This invention relates to a multi-layered dielectric film that is used as a coating film coated on the facets of semiconductor laser devices such as distributed feedback or distributed Bragg reflection semiconductor laser device's with gratings inside thereof, so as to control oscillation operation in the Fabry-Pérot resonator of the semiconductor laser devices and to attain oscillation arising from the diffraction of laser due to the inner gratings. This invention also relates to a multi-layered dielectric film that is coated on the end surfaces or other surfaces of optical products such as optical discs used in optical communication systems, so as to improve the optical transmission efficiency thereof and to prevent the ghost phenomena therein.

2. Description of the prior art

As a low-reflection protective film that is coated on the facets of, for example, a semiconductor laser device, a film of $Al_2O_3$ or a multi-layered dielectric film that is composed of this film and another dielectric film has been used, which is disclosed, for example, in Japanese Laid-Open Patent Publication No. 61-207091.

This film made of $Al_2O_3$ with a thickness of ¼ of the target wavelength that is much used as a dielectric coating film with a low reflection has a theoretical reflectivity of 0 for the specific wavelength, but the reflectivity thereof at wavelengths nearby the said specific wavelength increases steeply. Accordingly, when this film is applied to semiconductor laser chips with the scattering of wavelength that are located in a row in one bar, it is difficult to obtain a reflectivity of 1% or less with all of the chips of one bar. The same results as above will be also obtained when the error in the film thickness in the manufacture of the film is about or more than ±10%.

It is also difficult to obtain the desired refractive index with the regulation with conventional dielectric films used in optical products such as semiconductor laser devices. In particular, when laserchip bars or the like are coated with the dielectric films, because there is scattering of the oscillatoon wavelength in each bar, it is difficult to have the semiconductor laser devices have the same refractive index over all of the bars (i.e., over a wide range of wavelengths).

SUMMARY OF THE INVENTION

The multi-layered dielectric film of this invention, which overcomes the above-discussed and numerous other disadvantages and deficiencies of the prior art, is coated on the end surfaces or other surfaces of optical products and composed of alternate layers consisting of two kinds of dielectric layer one of which is a first dielectric layer of $TiO_2$ or ZnS with a high refractive index $n_1$ and the other of which is a second dielectric layer of $Al_2O_3$ with a low refractive index $n_2$.

In a preferred embodiment, the optical products are semiconductor laser devices and said end surfaces are the facets of said laser devices that are formed by cleavage.

Thus, the invention described herein makes possible the objectives of (1) providing a multi-layered dielectric film with either low or high reflectivity that can be used over a wide range of wavelengths; (2) providing a multi-layered dielectric film that has an uniform reflectivity and is obtainable with reproducibility even when there is scattering in the thickness of each layer constituting the said multi-layered dielectric film and in the oscillation wavelength of each semiconductor laser device to which the said multi-layered dielectric film is applied; and (3) providing a multi-layered dielectric film that has a refractive index over a wide range, which makes it possible to apply to semiconductor laser devices with various oscillation wavelengths.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1:
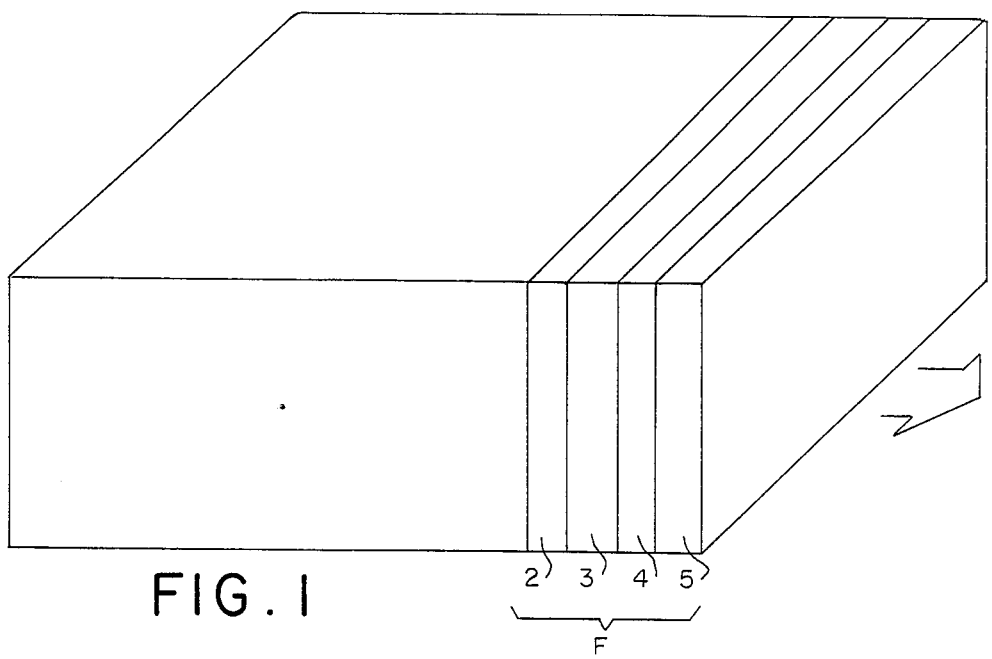
FIG. 1 is a perspective view showing a multi-layered dielectric film of this invention that is applied to one facet of a semiconductor laser device.

An example in which a multi-layered dielectric film of this invention is used as a low-reflective coating film is described with reference to drawings below:

FIG. 1 shows a multi-layered dielectric film of this invention that is applied to one facet of a semiconductor laser device, in which on one facet of a 7800 Å-band semiconductor laser chip 1, a multi-layered dielectric film F that is composed of alternate layers consisting of $TiO_2$ or ZnS layers 2 and 4 with a high refractive index and $Al_2O_3$ layers 3 and 5 with a low refractive index. The thickness of each of the four layers 2–5 is ¼ of the target wavelength. The formation of the films are performed by electron-beam vapor deposition. Sputtering deposition, an ion-plating technique, or the like can be also applicable.

The multi-layered dielectric film was applied to one facet of a semiconductor laser chip 1 that has an oscillation wavelength λ of 7800 Å and has an equivalent refractive index of 3.4 at the facet. $TiO_2$. was deposited to a thickness of λ/4 or 886 Å on the facet of the laser chip 1 to form a $TiO_2$ layer 2 with a refractive index of 2.2. Then, $Al_2O_3$ was deposited to a thickness of λ/4 or 1219 Å on the $TiO_2$ layer 2 to form an $Al_2O_3$ layer 3 with a refractive index of 1.6. In the same way, $TiO_2$ layer 4 and $Al_2O_3$ layer 5 were formed successively on the $Al_2O_3$ layer 3. The regulation of the thicknesses of these layers was accomplished by regulating the open-shut time of the shutters of two deposition sources that contain the deposition targets, $Al_2O_3$ and $TiO_2$, respectively, by the use of a quartz-crystal oscillation-type layer-thickness monitor. The regulation of the refractive indexes of these layers was performed by regulating the partial pressure of oxygen that was required with a high purity for the deposition of the $TiO_2$ layers and by regulating the rate of deposition.

Figure 2:
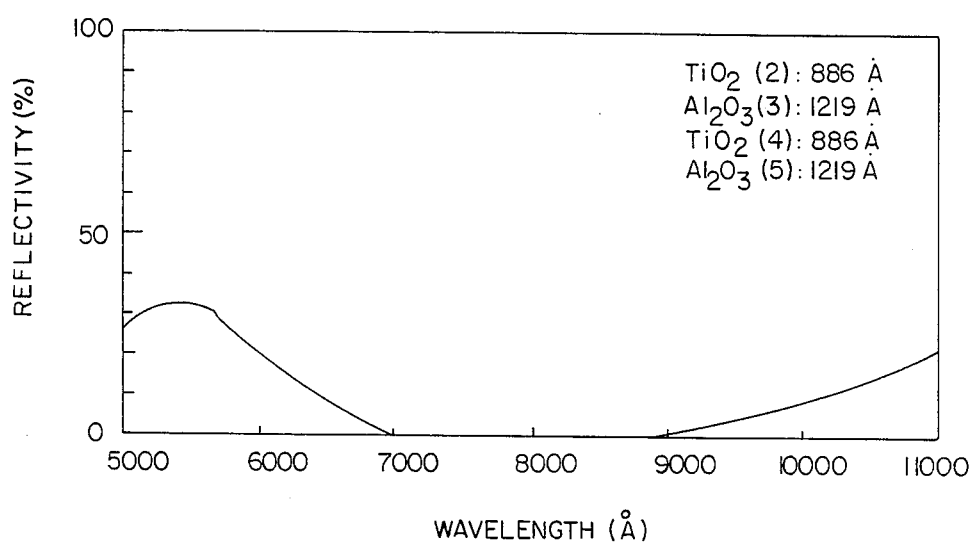
FIG. 2 is of a graph showing the spectral characteristics of the multi-layered dielectric film shown in FIG. 1.

FIG. 2 shows the spectral characteristics of the low-reflection coating film obtained in the above-mentioned manner, indicating that the coating film has a reflectivity of 1% or less over a wide range of 7000 Å to 8800 Å.

Figure 3:
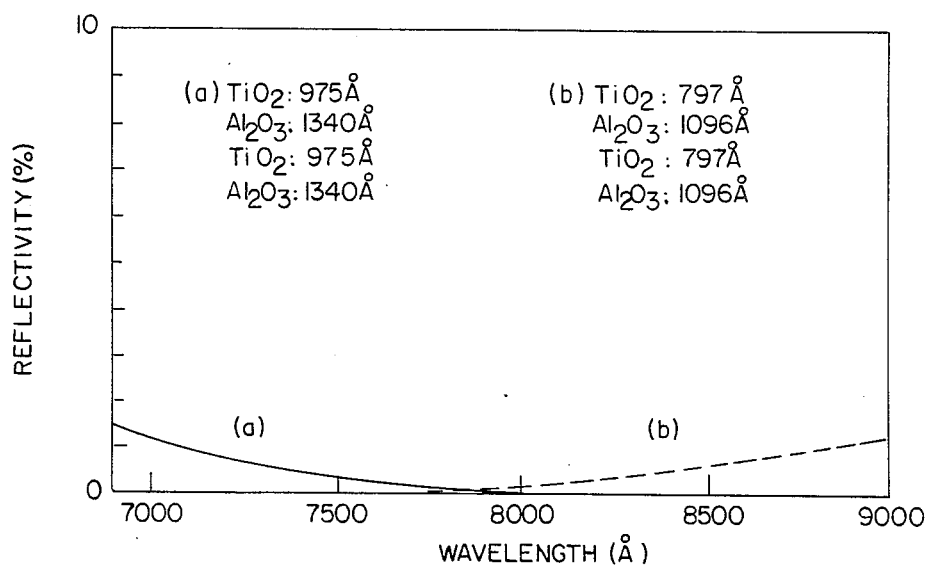
FIG. 3 is of graphs showing the spectral characteristics of two other multi-layered dielectric films of this invention.

FIG. 3 shows the spectral characteristics of a low-reflection coating film in which the thickness of each of the deposited layers is deviated within ±10% from those of the above-mentioned deposited layers. Item a in FIG. 3 indicates that the thickness of each of the layers is thicker than those of the afore-mentioned layers by 10%; namely, the TiO$_2$ layers have a thickness of 975 Å each and the Al$_2$O$_3$ layers have a thickness of 1340 Å each. Item b in FIG. 3 indicates that the thickness of each of the layers is thinner than those of the afore-mentioned layers by 10%; namely, the TiO$_2$ layers have a thickness of 797 Å each and the Al$_2$O$_3$ layers have a thickness of 1096 Å each. It can be seen from FIG. 3 that the said coating film also has a reflectivity of 1% or less over a wide range of 7000 Å to 8800 Å.

With conventional low-reflection coating films, if the regulation of the thickness of each layer constituting the said coating films were not strictly controlled, the spectral characteristics of the coating films scatter largely with respect to wavelengths. In contrast, the coating film of this invention that was used as a low-reflection film has an uniform reflectivity of 1% or less and is obtainable with reproducibility even though there is considerable scatter with respect to the thickness of each layer constituting the said coating film and the oscillation wavelengths of laser-chip bars.

Moreover, the coating film of this invention is advantageous in that the partial pressure of oxygen to be introduced when the TiO$_2$ layers are formed by deposition is regulated so that the selection of a desired refractive index can be carried out over a wide range. Accordingly, low-reflection coating films that are made of a various combination of TiO$_2$ layers with a certain thickness and Al$_2$O$_3$ layers with a certain thickness can be applied to the facets of semiconductor laser chips with various oscillation wavelengths, so that these low-reflection coating films can be used over a wide range of equivalent refractive indexes of laser devices.

Example 2

Another multi-layered dielectric film that is composed of alternate layers consisting of two ZnS layers with a thickness of λ/4 each and two Al$_2$O$_3$ layers with a thickness of λ/4 each (i.e., a ZnS/Al$_2$O$_3$/ZnS/Al$_2$O$_3$ multi-layered film) was disposed by electron-beam vapor deposition on one facet of a semiconductor laser device with an oscillation wavelength of 7800 Å. The said dielectric film exhibited spectral characteristics such as those of FIG. 2, and it was observed that if there were scatter within ±10% with respect to the thickness of each layer thereof, the said dielectric film has a reflectivity of 1% or less.

In the case where a low-refractive index dielectric layer is disposed, first, and then a high-refractive index dielectric layer is disposed on the low-refractive index layer to form a multi-layered dielectric film, when the thicknesses and the number of the disposed layers are set at optimum values, the resulting multi-layered dielectric film can be used as a high-reflection coating film that is applicable over a wide range of oscillation wavelengths.

Although the above-mentioned examples disclose only the use of the multi-layered film as a coating film that is applied to one facet of a semiconductor laser device, this invention is, of course, applicable to a low-reflection or high-reflection coating film that is applied to end surfaces or other surfaces of optical products used for specific wavelengths.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

We claim:

1. A multi-layered dielectric film coated on the end surfaces or other surfaces of optical products, wherein the multi-layered dielectric film comprises alternate dielectric layers, one of which is a first dielectric layer of TiO$_2$ with a high refractive index n$_1$ and the other of which is a second dielectric layer of Al$_2$O$_3$ with a lower refractive index n$_2$.

2. A multi-layered dielectric film according to claim 1, wherein said optical products are semiconductor laser devices and said end surfaces are the facets of said laser devices that are formed by cleavage.

* * * * *